United States Patent
Tsukamoto et al.

(10) Patent No.: US 6,723,475 B2
(45) Date of Patent: Apr. 20, 2004

(54) REFLECTION-TYPE MASK FOR USE IN PATTERN EXPOSURE, MANUFACTURING METHOD THEREFOR, EXPOSURE APPARATUS, AND METHOD OF MANUFACTURING A DEVICE

(75) Inventors: Masami Tsukamoto, Kanagawa (JP); Keiko Chiba, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 09/842,056

(22) Filed: Apr. 26, 2001

(65) Prior Publication Data

US 2001/0038953 A1 Nov. 8, 2001

(30) Foreign Application Priority Data

May 1, 2000 (JP) .......................... 2000-132372

(51) Int. Cl.$^7$ ............................. G03F 9/00; G21K 5/00
(52) U.S. Cl. .................................... 430/5; 378/35
(58) Field of Search ..................... 430/5, 322; 378/35, 378/43; 204/192.12, 192.13, 192.25, 192.11; 250/492.21

(56) References Cited

U.S. PATENT DOCUMENTS

| | | | |
|---|---|---|---|
| 4,735,877 A | 4/1988 | Kato et al. .................... 430/5 |
| 5,399,448 A | 3/1995 | Nagata et al. ................ 430/5 |
| 5,422,921 A | 6/1995 | Chiba .......................... 378/34 |
| 5,553,110 A | 9/1996 | Sentoku et al. ............. 378/35 |
| 5,770,335 A | 6/1998 | Miyake et al. .............. 430/5 |
| 5,846,676 A | 12/1998 | Chiba et al. ................. 430/5 |
| 5,870,448 A | 2/1999 | Maehara et al. ............. 378/35 |
| 5,889,758 A | 3/1999 | Maehara et al. ............. 378/35 |
| 6,101,237 A | 8/2000 | Miyachi et al. .............. 378/35 |
| 6,178,221 B1 * | 1/2001 | Levinson et al. ............ 378/35 |
| 6,387,574 B1 * | 5/2002 | Amemiya ..................... 430/5 |

OTHER PUBLICATIONS

Murakami, Katsuhiko, "Fabrication of Electroplated Reflection Masks for Extreme Ultraviolet Lithography by Electrocrystallization Method" *Surface Technology*, vol. 49, No. 8, 1998, pp. 47–51.

Korean Office Action dated Aug. 1, 2003, issued in a corresponding Korean pat nt application..

* cited by examiner

*Primary Examiner*—S. Rosasco
(74) *Attorney, Agent, or Firm*—Fitzpatrick, Cella, Harper & Scinto

(57) ABSTRACT

A reflection-type mask for use in exposing a pattern onto a photosensitive material, wherein the mask includes a reflection area, having a multilayer film, for reflecting exposure light, and a non-reflection area which does not reflect the exposure light, the reflection area and the non-reflection area forming a mask pattern, wherein at least one layer of the multilayer film consists of an impurity semiconducter, whereby bad influences, for example, caused by poor conduction of the multilayer film at mask-production stage, can be prevented.

35 Claims, 8 Drawing Sheets

REFLECTION-TYPE MASK FOR USE IN PATTERN EXPOSURE, MANUFACTURING METHOD THEREFOR, EXPOSURE APPARATUS, AND METHOD OF MANUFACTURING A DEVICE

BACKGROUND OF THE INVENTION

1. Field of the Invention

The present invention relates to the following subject matter: reflection-type masks for use in pattern exposure for projecting mask patterns thereof by reflecting exposure light, manufacturing methods therefor, exposure apparatuses using the reflection-type masks for use in pattern exposure, methods of manufacturing devices by using the exposure apparatuses, and semiconductor devices manufactured by the methods of manufacturing devices.

2. Description of the Related Art

In recent years, semiconductor integrated circuits having smaller features have been designed, and concomitant with this trend, exposure apparatuses for transferring circuit patterns on wafers are required to have the ability to transfer even finer circuit patterns. The abilities of exposure apparatuses largely depend on the wavelength of the exposure light, and hence, exposure apparatuses for exposing finer circuit patterns tend to use exposure light having shorter wavelengths. As exposure apparatuses having the ability to transfer a finer circuit pattern as described above, soft x-ray reduction projection exposure apparatuses have been investigated. The soft x-ray reduction projection exposure apparatus is an apparatus in which x-rays are generated from a light source, a reflection-type mask having a mask pattern formed therein is irradiated by the x-rays, and reductive projection is then performed onto a resist coated on a wafer by the x-rays reflected at the reflection-type mask.

As a reflection-type mask for use in soft x-ray reduction projection exposure apparatuses, a multilayer reflection film reflecting x-rays is typically provided on a substrate having a predetermined shape, which is formed by alternately depositing two types of materials having different refractive indexes. The combination of materials constituting a multilayer reflection film is changed in accordance with the wavelength of x-rays to be reflected. For example, for x-rays having a wavelength of approximately 13 nm, molybdenum (Mo) and silicon (Si) are used, and for x-rays having a wavelength of approximately 5 nm, chromium (Cr) and carbon (C) are typically used. In general, as the topmost surface of the multilayer reflection film, a material is selected having a refractive index largely differing from that in a vacuum or a processing atmosphere, and among the materials mentioned above, a Mo layer or a Cr layer may be used. Since a multilayer reflection film composed of Mo and Si most stably gives a high reflectance at present, the practical use thereof is hopefully expected.

The thicknesses of individual layers constituting the multilayer reflection film described above are determined by the wavelength of the incident x-rays, the incident angle thereof, constituent materials for the multilayer reflection film, and the like. When incident x-rays are perpendicular to the surface of the multilayer reflection film, the thickness of a pair of layers adjacent to each other is approximately one-half of the wavelength of the incident x-rays. In addition, in general, comparing the two layers mentioned above, a layer having a smaller absorption coefficient of x-rays is slightly thicker than the other layer having a larger absorption coefficient of x-rays. Accordingly, when x-rays having a wavelength of thirteen nm are used, the thickness of the Mo layer of the multilayer reflection film is slightly smaller than three nm, that is, the layer is extremely thin.

There are two major methods for manufacturing mask patterns. One method is that non-reflection areas, which do not reflect x-rays, are formed by covering a multilayer reflection film with a patterned absorption layer so as to form a mask pattern. The other method is that non-reflection areas are formed by removing or destroying parts of a multilayer reflection film so as to directly form a mask pattern in the multilayer reflection film.

FIG. 1 is a cross-sectional view of a conventional reflection-type mask for use in a soft x-ray reduction projection exposure apparatus. As shown in FIG. 1, a multilayer reflection film 9 is formed on a substrate 3 having a predetermined shape by alternately depositing Mo layers 1 and Si layers 5, which reflect x-rays. On the upper surface of the multilayer reflection film 9, an absorption layer 4 is formed for absorbing x-rays and is patterned so as to cover parts of the multilayer reflection film 9.

The absorption layer 4 is formed of a material having a large absorption coefficient of x-rays to be used. In general, a heavy element, such as gold (Au), tungsten (W), or tantalum (Ta), is used. The absorption coefficients of these materials mentioned above differ in accordance with the wavelength of the incident x-rays, and hence, a material constituting the absorption layer 4 is preferably selected based on the wavelength of x-rays to be used.

As a method for forming a mask pattern in the absorption layer 4, an electroplating method may be used. In this method, a resist layer (not shown) is first formed on the multilayer reflection film 9, and the resist layer is then patterned by using an electron beam lithographic method. Subsequently, the absorption layer 4 is formed by using an electroplating method, and a mask pattern is then formed in the absorption layer 4 by removing the resist layer by dry etching. In addition to the method using an electroplating method, a sputtering deposition method, an evaporation method, or the like method may be used, so as to form the absorption layer 4 on the multilayer reflection film 9.

An electroplating method has advantages in that the absorption layer 4 can be easily formed with less damage imposed on the multilayer reflection film 9. In "Surface Technology", Vol. 49, No. 8, (1998), pp. 47 to 51, it is reported that a superior absorption layer 4 composed of nickel (Ni) is obtained by an electroplating method.

When the absorption layer 54 is formed by an electroplating method, the topmost surface layer of the multilayer reflection film 9 must be composed of a conductive material. According to "Surface Technology", Vol. 49, No. 8, (1998), pp. 47 to 51, described above, when the topmost surface layer of the multilayer reflection film 9 is formed of a Mo layer 1, an absorption layer 4 composed of Ni is preferably formed, and when the topmost surface layer of the multilayer reflection film 9 is formed of a Si layer 5, Ni in a spherical shape is only formed, whereby no absorption layer 4 is practically obtained.

The reflectance of the absorption layer 4 depends on the thickness thereof. For example, when the thickness of the absorption layer 4, which consists of Au on the multilayer reflection film having a reflectance of 70%, is 30 nm, the x-ray reflectance thereof is 6%, and when the thickness of the absorption layer 4 is decreased by 10%, that is, when the thickness is decreased to 27 nm, the reflectance thereof is 7.7%. Accordingly, when the thickness of the absorption layer 4 is not uniform, the reflectance thereof varies within the absorption layer 4. The variation in reflectance in the absorption layer 4 results in errors in line widths of a circuit pattern on a wafer. Hence, the thickness of the absorption layer 4 must be uniform. The variation in reflectance of the absorption layer 4 can be controlled by sufficiently increasing the thickness of the absorption layer 4. However, incident x-rays to a reflection-type mask are not ideally perpendicular to the surface of the reflection-type mask and are inclined at an angle of some degrees thereto. In the case described above, when the thickness of the absorption layer is large, errors are generated in the circuit pattern on the wafer due to shadows cast by the thickness of the absorption layer 4. Accordingly, the thickness of the absorption layer 4 is preferably reduced to a minimum level as long as the absorption layer 4 serves as expected.

In addition, when the multilayer reflection film 9 is directly patterned, patterning may be performed by removing parts of the multilayer reflection film 9. However, in order to form non-reflection areas which do not reflect x-rays, since the reflectance of areas at which non-reflection areas are formed is merely decreased, patterning may be performed only by destroying parts of the multilayer structure of the multilayer reflection film 9. As a method of removing or destroying parts of the multilayer structure of the multilayer reflection film 9, a method of performing direct patterning by a converging ion beam (or focused ion beam) method or a method performing dry etching after a resist pattern is formed may be used.

As described above, in the steps of manufacturing reflection-type masks, there are many steps using charged particles, such as ions or electrons. In these steps, when the conductivity of a material to be processed is low, charge up occurs, that is, the material to be processed is electrified, and hence, the problems may arise in that the accuracy of a mask pattern to be formed is degraded or the like. Accordingly, in the steps of manufacturing reflection-type masks, the multilayer reflection film 9 must have sufficient conductivity.

The topmost surface layer of the multilayer reflection film 9 of the conventional reflection-type mask described above is formed of a conductive material; however, a layer in contact with the topmost surface layer is formed of a non-conductive material in many cases. As a result, the conductivity of the multilayer reflection film 9 is secured only by the topmost surface layer thereof.

The thickness of the topmost surface layer is approximately one-fourth of the wavelength of the x-rays, i.e., several nm, and hence, the conductivity of the topmost surface layer is only approximately one-tenth to one-to-several of the bulk value.

In addition, the reduction ratio of a reduction projection exposure apparatus is typically approximately one-fourth to one-fifth, and the size of the mask is 100 mm by 100 mm or more. In the steps of manufacturing a mask pattern, an electrode for securing the conductivity is provided outside the exposure area. Accordingly, the conductivity, which is required in the step of manufacturing the mask pattern, is not satisfactory in the most distant pattern portion from the electrode because of the extremely thin topmost surface layer of the multilayer reflection film.

In the case described above, when electron beam lithography is performed for the resist layer formed on the multilayer reflection film 9 for forming the absorption layer 4, it is difficult to remove charges accumulated in the resist layer when the conductivity of the multilayer reflection film 9 is low, which is located under the resist layer, whereby charge up occurs, and the pattern accuracy is degraded. In addition, when the multilayer reflection film 9 is directly patterned by a focused ion beam method, charge up occurs on the surface of the multilayer reflection film 9, and as a result, the pattern accuracy is degraded.

Furthermore, when the multilayer reflection film 9 cannot have sufficient conductivity even by an electroplating method, the thickness of the absorption layer 4 is gradually decreased in accordance with the distance from the electrode, and as a result, the thickness of the absorption layer 4 becomes uneven. In the case in which an electrode is provided at an edge of the multilayer reflection film 9, and the absorption layer 4 is formed by using a sulfite plating solution, an absorption layer 4 is formed having an uneven thickness. When the size of a mask is 100 by 100 mm, the thickness of the absorption layer 4 at the portion thereof, which is most distant from the electrode, is decreased by approximately 10%. When an absorption layer 4 having an uneven thickness can only be formed, the thickness of the absorption layer 4 cannot be decreased as described above, and consequently, the accuracies of line widths and a location of the circuit pattern formed on a wafer are degraded.

As described above, the conventional reflection-type mask for use in pattern exposure has the following two problems.
(1) When an electron beam lithographic method or a focused ion beam method is performed in the steps of manufacturing a mask pattern, since the multilayer reflection film has insufficient conductivity, charge up occurs in the multilayer reflection film, and as a result, the accuracy of the mask pattern is degraded. Consequently, the accuracies of line widths and a location of the circuit pattern formed on a wafer are degraded.
(2) When an electroplating method is performed in the step of forming an absorption layer, since the multilayer reflection film has insufficient conductivity, an absorption layer having an uneven thickness can only be formed, and hence, the reflectance of the absorption layer varies. As a result, the accuracies of line widths and a location of the circuit pattern formed on a wafer are degraded. In addition, since the absorption layer having an uneven thickness can only be formed, the thickness of the absorption layer cannot be decreased. As a result, the accuracies of line widths and a location of the circuit pattern formed on a wafer are degraded due to a shadowing effect of the x-rays.

SUMMARY OF THE INVENTION

Accordingly, it is an object of the present invention to provide a reflection-type mask for use in pattern exposure to improve the accuracies of line widths and a location of a circuit pattern formed on a wafer by eliminating bad influences caused by insufficient conduction in manufacturing steps. Accordingly, for example, charge up can be constrained, which is generated in a step of performing an electron beam lithographic method, a focused ion beam method, or the like, and an absorption layer having a uniform thickness can be formed in an electroplating method or the like.

In one aspect, the present invention provides a reflection-type mask for use in exposing a pattern onto a photosensitive material. The mask includes a reflection area, having a multi-layer film, for reflecting exposure light and a non-reflection area which does not reflect the exposure light, the reflection area and the non-reflection area forming a mask pattern. At least one layer of the multi-layer film consists of an impurity semiconductor.

In another aspect, the present invention provides a method of producing a reflection-type mask for use in exposing a pattern onto a photosensitive material, the mask comprising a reflection area, having a multi-layer film, for reflecting exposure light, and a non-reflection area which does not reflect the exposure light, wherein the reflection area and the non-reflection area form a mask pattern. The method includes forming the multi-layer film, such that one layer of the multi-layer film consists of an impurity semiconductor, and forming the non-reflection area.

In yet another aspect, the present invention provides an exposure apparatus that includes a light source for emitting exposure light and an illumination optical system for illuminating a reflection-type mask by the exposure light from the light source. The reflection-type mask includes a reflection area, having a multi-layer film, for reflecting exposure light and a non-reflection area which does not reflect the exposure light, the reflection area and the non-reflection area forming a mask pattern, and at least one layer of the multi-layer film consisting of an impurity semiconductor. A photosensitive material is exposed by the exposure light from the reflection-type mask, which is exposed by the illumination optical system.

In still another aspect, the present invention provides a method of manufacturing a device. The method includes illuminating a reflection-type mask by exposure light, the reflection-type mask comprising a reflection area, having a multi-layer film, for reflecting exposure light and a non-reflection area which does not reflect the exposure light, the reflection area and the non-reflection area forming a mask pattern, and at least one layer of the multi-layer film consisting of an impurity semiconductor, exposing a photosensitive material by the exposure light from the reflection-type mask and developing the photosensitive material exposed by the exposure light, such that a circuit pattern is produced by using the developed photosensitive material.

Further objects, features and advantages of the present invention will become apparent from the following description of the preferred embodiments with reference to the attached drawings.

DESCRIPTION OF THE PREFERRED EMBODIMENTS

Figure 1:
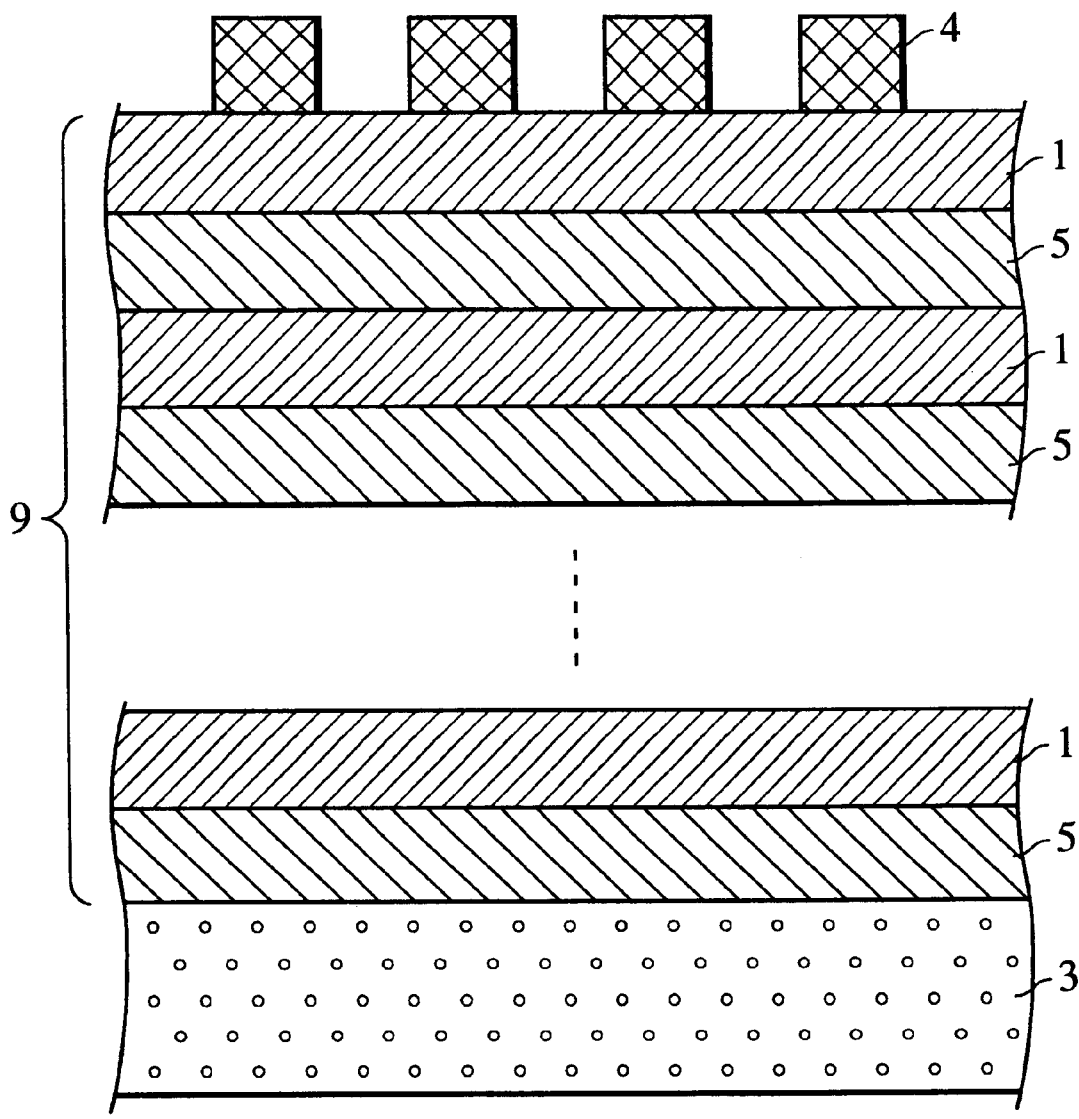
FIG. 1 is a cross-sectional view showing the structure of a conventional reflection-type mask for use in pattern exposure.

In the embodiments described below, a reflection-type mask for use in pattern exposure comprises a reflection area reflecting exposure light composed of a multilayer reflection film formed by alternately depositing materials having different optical constants, and a non-reflection area not reflecting the exposure light, wherein at least one layer of the multilayer reflection film is an impurity semiconductor.

In the reflection-type mask described above, since the conductivity of the multilayer reflection film can be improved when at least one layer constituting the multilayer reflection film is an impurity semiconductor, charge up can be constrained, which is generated in the multilayer reflection film in a step of forming a mask pattern of the reflection-type mask, and the accuracies of the line widths and a location of the mask pattern can be improved, whereby the accuracies of the line widths and a location of a circuit pattern can be improved.

In addition, in the reflection-type mask described above, when the absorption layer is formed by an electroplating method, the uniformity of the thickness of the absorption layer is improved, which is formed on the multilayer reflection film, and hence, the variation of the reflectance of the absorption layer is reduced. As a result, the accuracies of line widths and a location of the mask pattern can be improved. Furthermore, since the film thickness of the absorption layer becomes uniform, a thin absorption layer can be formed, and hence, a shadowing effect of x-rays can be reduced, which is generated by the thickness of the absorption layer. Consequently, the accuracies of line widths and a location of the circuit pattern can be improved.

In the embodiment described above, an impurity in the impurity semiconductor may be one of elements in Group III or in Group V of the periodic table.

When the impurity is one of the elements in Group III or in Group V, the conductivity of the multilayer reflection film can be improved without significant degradation of reflectance of the multilayer reflection film.

Next, the embodiments of the present invention will be described in detail with reference to the accompanying figures. In every figure, constituent elements indicated by the same reference numeral are the same.

Embodiment 1

Figure 2:
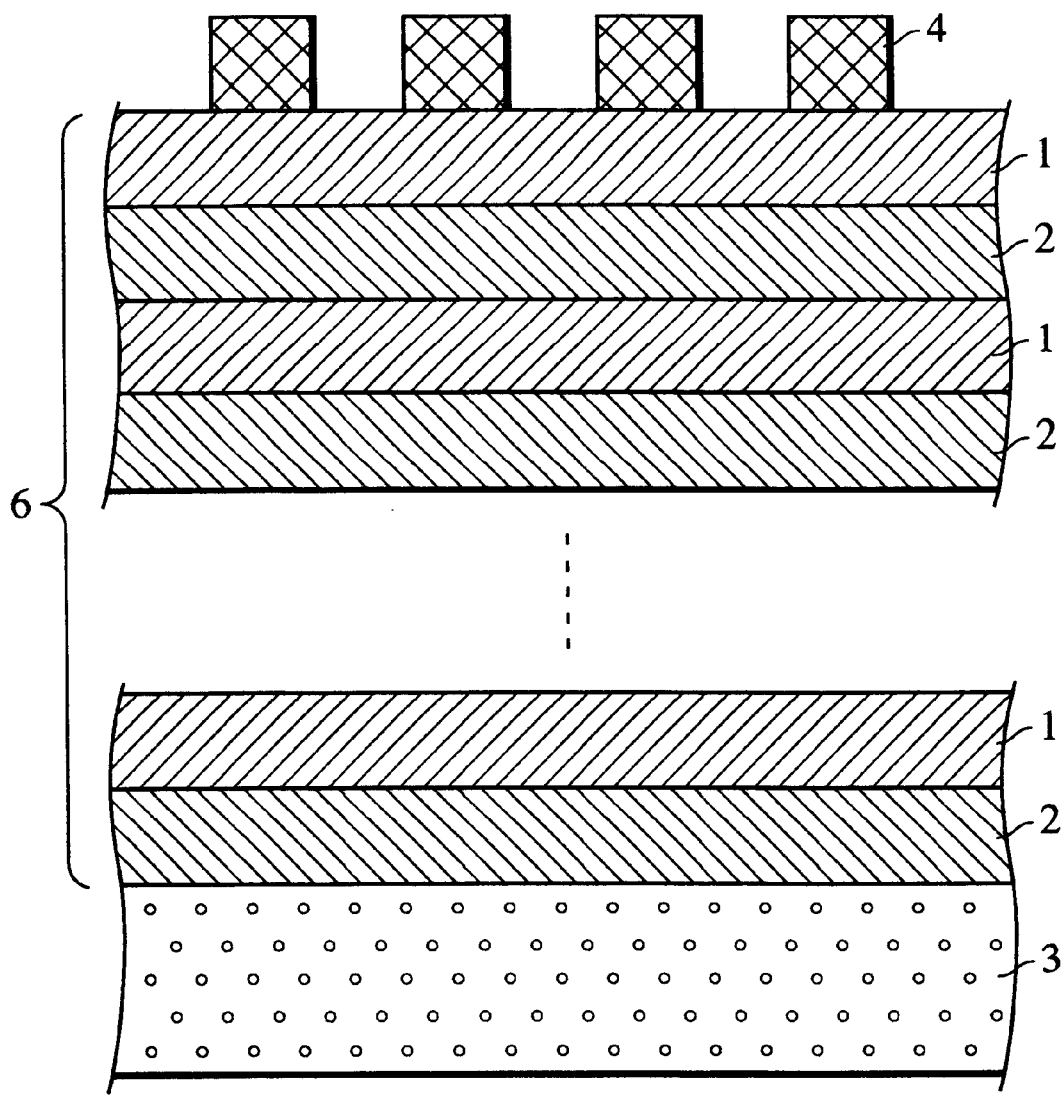
FIG. 2 is a cross-sectional view showing the structure of a reflection-type mask for use in pattern exposure according to a first embodiment of the present invention.

A reflection-type mask for use in pattern exposure according to a first embodiment of the present invention will first be described. FIG. 2 is a cross-sectional view showing the structure of the reflection-type mask of this embodiment. The reflection-type mask of this embodiment is used in a reduction projection exposure apparatus.

A multilayer reflection film 6 is formed in an area 100 by 100 mm on a substrate 3 composed of quartz. The multilayer reflection film 6 is formed by alternately depositing Mo layers 1 and Si layers 2 doped with boron (B). The multi-layer reflection film 6 is formed by using a high-frequency (hereinafter referred to as RF) magnetron sputtering deposition method in which a target is electrified by electrons, and a film is formed by adhering ions, which are produced by driving out electrons from the target, to a base material. The Si layer 2 is formed by using a target composed of Si containing B at a concentration of 0.2%. The multilayer reflection film 6 is formed of eighty Mo layers 1 alternately deposited with eighty Si layers 2, and the thickness of the Mo layer 1 and the thickness of the Si layer 2 are 3.1 nm and 3.6 nm, respectively.

The reflectance of the multilayer reflection film 6 is approximately 70% at a 13 nm wavelength and an incident angle of five degrees from the perpendicular of the surface, and a decrease in reflectance is scarcely observed by doping the Si layer 2 with B.

Figure 3A:
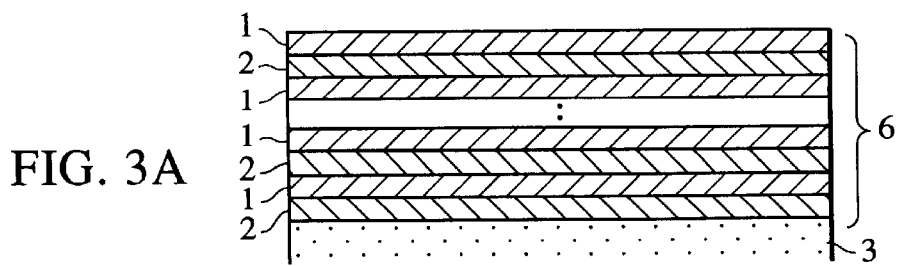
FIGS. 3A to 3E are cross-sectional views showing steps of manufacturing the reflection-type mask according to the first embodiment of the present invention.
Figure 3B:
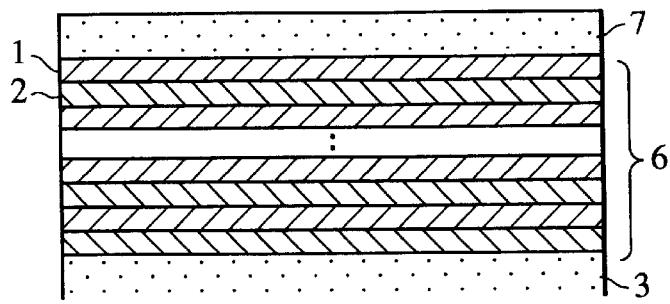
Figure 3C:
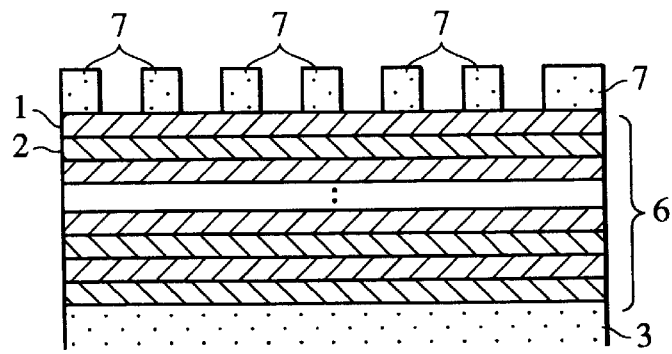
Figure 3D:
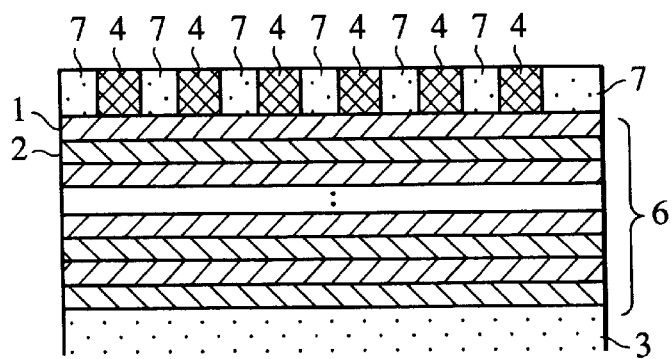
Figure 3E:
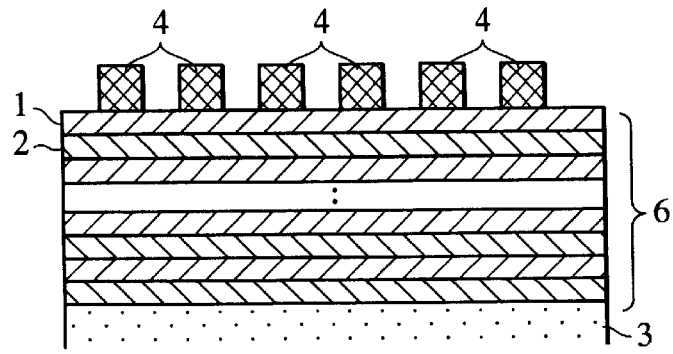

An absorption layer 4 composed of Au is formed on the multilayer reflection film 6. In a reduction projection exposure apparatus, when a circuit pattern is formed on a wafer, the ratio of the x-ray intensity at an exposure portion to that at a non-exposure portion must be 10 to 1 or less. In order to make the ratio described above 10 to 1 or less, the thickness of the absorption layer 4 must be 28 nm or more. FIGS. 3A to 3E are cross-sectional views showing steps of manufacturing the reflection-type mask according to this embodiment. As shown in FIG. 3A, the multilayer reflection film 6 is first formed on the substrate 3 by an RF magnetron sputtering deposition method. Next, as shown in FIG. 3B, a resist layer 7 is formed by coating on the multilayer reflection film 6. As shown in FIG. 3C, a predetermined resist pattern is formed in the resist layer 7 by an electron beam lithographic method. Subsequently, as shown in FIG. 3D, the absorption layer 4 composed of Au is formed by an electroplating method on the multilayer reflection film 6 at areas at which the resist layer 7 is removed. Finally, as shown in FIG. 3E, a mask pattern is formed by removing the resist layer 7 by dry etching.

In the reflection-type mask of this embodiment, the line width of the mask pattern thus formed is 0.25 μm, the accuracy of the line widths is approximately ±5%, and the accuracy of a location is approximately 10 nm. In addition, the thickness of the absorption layer 4 thus formed is approximately uniform in the exposure area. Compared to the reflection-type mask of this embodiment, in a reflection-type mask composed of a conventional multilayer reflection film using Si layers 2 without doping of B, since charge up is generated when the resist layer is processed by an electron beam lithographic method, the accuracy of the line widths is degraded to ±20%, and the accuracy of a location is degraded, such as approximately 20 nm. In addition, when the absorption layer is formed by an electroplating method, a pattern portion, which is distant from the electrode, cannot have sufficient conductivity, and as a result, the thickness of the absorption layer thus obtained is uneven.

As described above, in the reflection-type mask of this embodiment, since the conductivity of the multilayer reflection film 6 is improved by doping the Si layers with B, charge up generated on the surface of the multilayer reflection film 6 can be constrained, and hence, the accuracies of line widths and a location of the mask pattern formed by an electron beam lithographic method can be improved. Consequently, the accuracies of line widths and a location of the circuit pattern formed on a wafer can be improved.

In addition, when the absorption layer is formed by an electroplating method, since the conductivity of the multilayer reflection film 6 is improved by doping the Si layers 2 with B, the thickness of the absorption layer 4 becomes uniform, and hence, the reflectance of the absorption layer 4 can be uniform in the exposure area. Consequently, the accuracies of line widths and a location of the circuit pattern formed on a wafer can be improved.

Furthermore, when the thickness of the absorption layer 4 becomes uniform, the thickness thereof can be decreased, and hence, a shadowing effect can be reduced which is caused by the thickness of the absorption layer 4. Consequently, the accuracies of line widths and a location of the circuit pattern formed on a wafer can be improved.

Embodiment 2

Next, a reflection-type mask for use in pattern exposure according to a second embodiment of the present invention will be described. The reflection-type mask of this embodiment is used in a reduction projection exposure apparatus and, as is the reflection-type mask of the first embodiment, comprises a multilayer reflection film formed of Mo layers alternately deposited with Si layers as shown in FIG. 1.

The Si layer is doped with phosphorus (P) at a concentration of 0.1%. Compared to a reflection-type mask without doping of P, the decrease in reflectance of this reflection-type mask is small, such as approximately 1.0%.

Similar to the case of the reflection-type mask of the first embodiment, in the reflection-type mask of this embodiment, the conductivity of the multilayer reflection film can be improved by doping the Si layers with P while the decrease in reflectance is constrained to be small.

Embodiment 3

Next, a reflection-type mask for use in pattern exposure according to a third embodiment of the present invention will be described. The reflection-type mask of this embodiment is used in a reduction projection exposure apparatus and, as is the reflection-type mask of the first embodiment, comprises a multilayer reflection film formed of Mo layers alternately deposited with Si layers as shown in FIG. 1.

The Si layer is doped with arsenic (As) at a concentration of 0.1%. Compared to a reflection-type mask without doping of As, the decrease in reflectance of this reflection-type mask is small, such as 7.0%.

Similar to the case of the reflection-type mask of the first embodiment, in the reflection-type mask of this embodiment, even though the impurity doped into the Si layers is As having a high x-ray absorption coefficient, since the doping concentration is controlled to be low, such as approximately 0.1%, the conductivity of the multilayer reflection film can be improved while the decrease in reflectance is constrained to be small.

In the reflection-type mask of this embodiment, instead of As, when gallium (Ga) is used at a concentration of 0.05%, the decrease in reflectance is 6%; when indium (In) is used at a concentration of 0.05%, the decrease in reflectance is 8%; when antimony (Sb) is used at a concentration of 0.05%, the decrease in reflectance is 8%; and when aluminum (Al) is used at a concentration of 0.05%, the decrease in reflectance is 4%.

As described above, even though the impurity contained in the Si layer is Ga, In, Sb, or Al having a high x-ray absorption coefficient, when each concentration thereof is controlled to be low, the conductivity of the multilayer reflection film can be improved while the decrease in reflectance is constrained to be small.

Embodiment 4

Next, a reflection-type mask for use in pattern exposure according to a fourth embodiment of the present invention will be described. The reflection-type mask of this embodiment is used in a reduction projection exposure apparatus and, as is the reflection-type mask of the first embodiment, comprises a multilayer reflection film formed of Mo layers 1 alternately deposited with Si layers as shown in FIG. 1.

Figure 4:
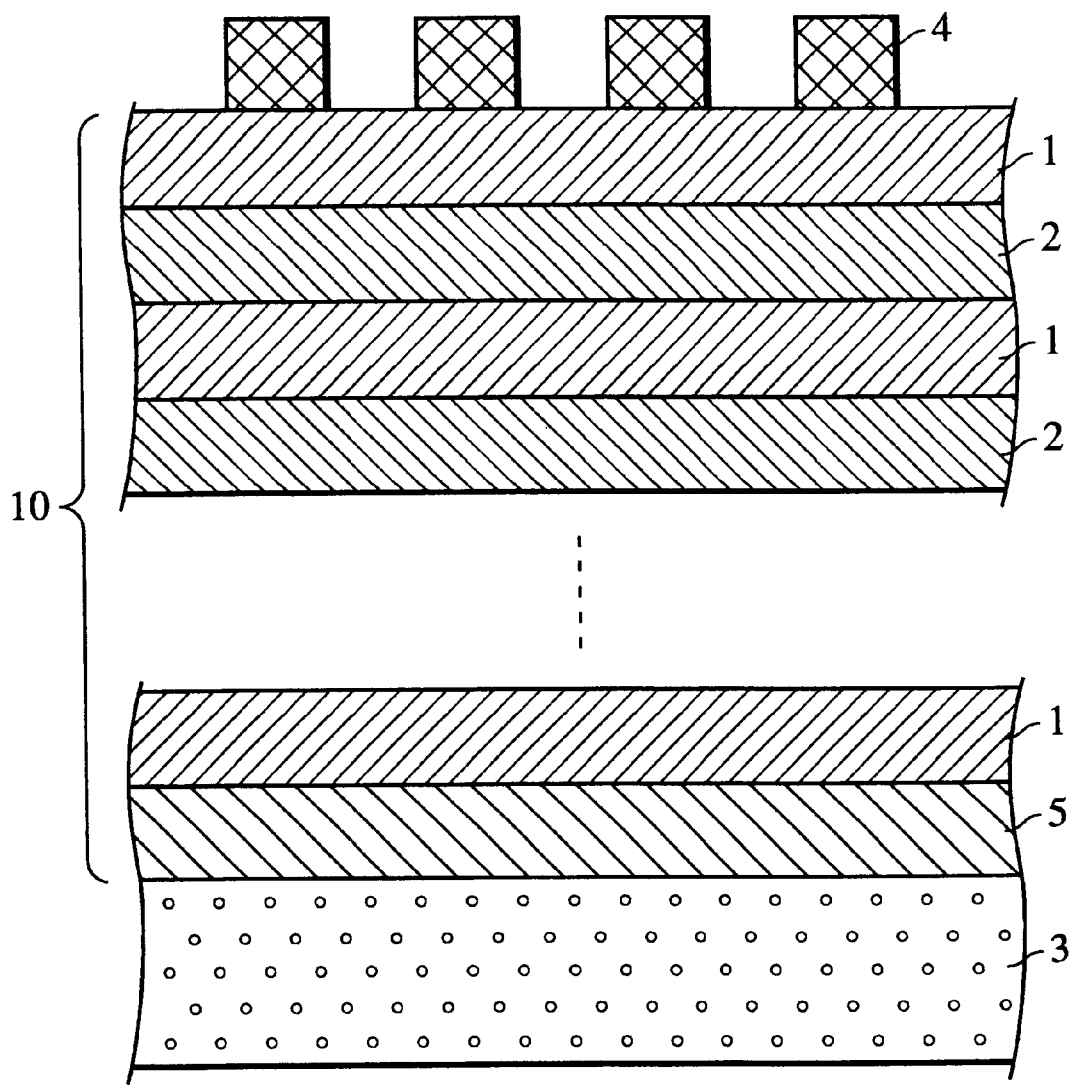
FIG. 4 is a cross-sectional view showing the structure of a reflection-type mask for use in pattern exposure according to another embodiment of the present invention.

In the reflection-type mask of this embodiment, when Si layers are formed, which are located from the top of the multilayer film to the center thereof in the laminated direction, by using a Si target containing B, the Si layers 2 are doped with B. FIG. 4 is a cross-sectional view showing the structure of the reflection-type mask of this embodiment. As shown in FIG. 4, the Si layers 2 located from the top to the center of the multilayer film are only doped with B, and the other Si layers 5 are not doped with B.

In the reflection-type mask of this embodiment, even though the Si layers 2 located from the top to the center of the multilayer film are only doped with B, the conductivity of the surface of the multilayer reflection film 10 is improved. Accordingly, as is the reflection-type mask of the first embodiment, charge up generated on the surface of the multilayer reflection film 10 can be constrained, and hence, the accuracies of line widths and a location of the mask pattern can be improved, which is formed in the absorption layer 4 by an electron beam lithographic method.

In addition, in the case in which the absorption layer 4 is formed by an electroplating method, when an absorption layer 4 is formed having a uniform thickness, the reflectance thereof can be approximately uniform in the exposure area. Furthermore, when the thickness of the absorption layer is minimized, the shadowing effect caused by the thickness of the absorption layer 4 can also be minimized.

When a CVD method is used for film formation, by mixing a gas (chloride or hydride of an impurity element) containing an impurity with a reaction gas, a Si layer doped with an impurity can be formed. In the case described above, an optional Si layer can be doped with an impurity by performing an on/off operation for an impurity gas supply. In the case in which an impurity gas is mixed with the reaction gas when layers are formed in the vicinity of the topmost surface of the multilayer reflection film, since the layers in the vicinity of the topmost surface are doped, the decrease in reflectance can be further constrained, and the conductivity can also be effectively increased. When a sputtering deposition method, an evaporation method, or the like is used for film formation, as is the case described above, layers doped with an impurity can be formed by adding a gas containing the impurity to the processing atmosphere.

Embodiment 5

Next, a reflection-type mask for use in pattern exposure according to a fifth embodiment of the present invention will be described. The reflection-type mask of this embodiment is used in a reduction projection exposure apparatus and, as is the reflection-type mask of the first embodiment, comprises a multilayer reflection film formed of Mo layers 1 alternately deposited with Si layers 2 as shown in FIG. 1. In addition, as is the reflection-type mask of the fourth embodiment, in the reflection-type mask of this embodiment, Si layers are doped with B, which are located from the top to the center of the multilayer film in the laminated direction. As a result, the conductivity in the vicinity of the surface of the multilayer reflection film can be improved.

Figure 5:
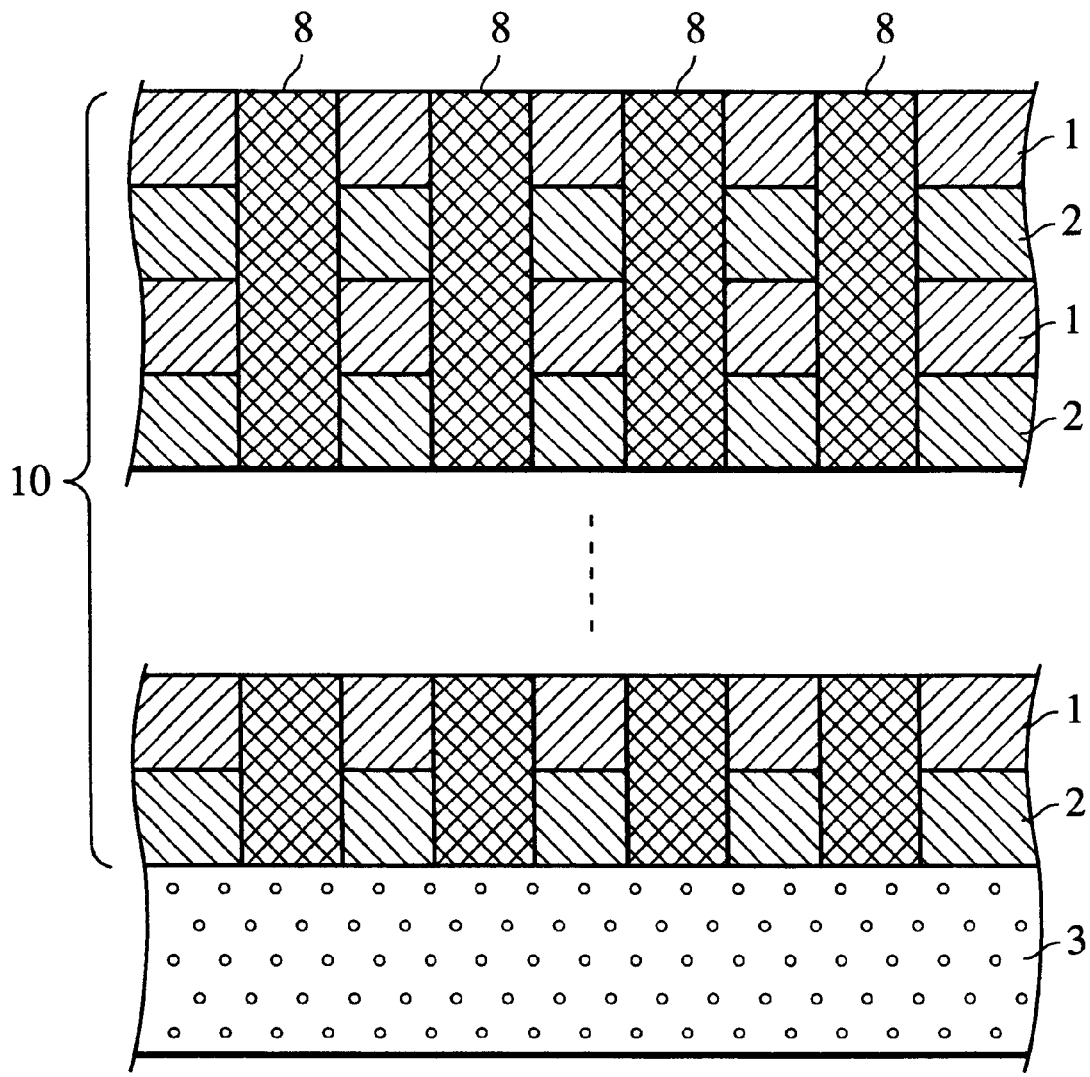
FIG. 5 is a cross-sectional view showing the structure of a reflection-type mask for use in pattern exposure according to yet another embodiment of the present invention.

FIG. 5 is a cross-sectional view showing the structure of the reflection-type mask of this embodiment. As shown in FIG. 5, in the reflection-type mask of this embodiment, without forming an absorption layer 4, which is shown in FIG. 4, non-reflection areas 8 are formed by destroying parts of the multilayer structure of the multilayer reflection film using a focused ion beam method, whereby a mask pattern is formed at the topmost surface of the multilayer reflection film 10.

In the reflection-type mask of this embodiment, since the conductivity of the multilayer reflection film 10 is improved by the B-doped Si layers located from the top to the center of the multilayer film, charge up generated on the surface of the multilayer reflection film 10 can be constrained, and hence, the accuracies of line widths and a location of the mask pattern can be improved, which is formed at the topmost surface of the multilayer reflection film 10 by a focused ion beam method.

In the reflection-type mask of this embodiment, the non-reflection areas 8 are formed by destroying the parts of the multilayer structure of the multilayer reflection film 10, and in addition, the non-reflection areas 8 may be formed by removing parts of the multilayer reflection film 10.

Embodiment 6

Next, a reflection-type mask for use in pattern exposure according to a sixth embodiment of the present invention will be described. The reflection-type mask of this embodiment is used in a reduction projection exposure apparatus and comprises a multilayer reflection film formed of Ru layers alternately deposited with Si layers. In addition, the Si layers are doped with B. Hereinafter, this embodiment will be described with reference to comparative examples.

The reflectance of a multilayer reflection film, formed of the Ru and the Si layers by an ion beam sputtering deposition method, is approximately 70% at an incidence angle of 5°. A decrease in reflectance of a multilayer reflection film, composed of Si layers doped with B at a concentration of 0.02%, is difficult to observe. Electrodes are provided at the periphery of an exposure area 100 by 144 mm on this multilayer film, and an absorption layer composed of Ni is formed by an electroplating method, thereby forming a reflection-type mask.

In a multilayer reflection film composed of Si layers without doping of B, since sufficient conductivity cannot be obtained, the thickness of the absorption layer at a central portion of the mask, which is distant from the electrodes, is decreased by approximately 10% compared to that of the absorption layer at the periphery of the mask. On the other hand, in the multilayer reflection film composed of the B-doped Si layers, the thickness of the absorption layer is uniform.

As described above, in the reflection-type masks for use in pattern exposure according to the first to sixth embodiments, when at least one Si layer is doped with B, the conductivity of the multilayer reflection film can be improved, and hence, the accuracies of line widths and a location of the mask pattern can be improved. In the case described above, when the number of Si layers doped with an impurity is increased, the effect described above can be further expected; however, for example, when the Si layer in contact with the topmost surface layer is only doped with an impurity, compared to the case in which a Si layer is not doped with an impurity, a preferable effect can be expected, in particular, for improvement in conductivity.

As an impurity for doping a silicon layer, an element in Group III or Group V may be used. As a dopant, B, P, or As is typically used, and in addition, Li, Sb, Bi, Al, Ga, In, or the like may also be used. When an element is used as a dopant, which has a high x-ray absorption coefficient, such as As or Sb, by decreasing the concentration thereof, the decrease in reflectance of the multilayer reflection film can be controlled to be small.

In addition, in the reflection-type masks according to the first to sixth embodiments, soft x-rays are described as exposure light; however, the present invention is not limited thereto, and, for example, vacuum ultraviolet light may also be used as exposure light. Furthermore, in the reflection-type masks according to the first to sixth embodiments, the reflection-type mask is described as a mask for use in a reduction projection exposure apparatus; however, the reflection-type mask of the present invention is not limited thereto and, for example, may be applied to exposure apparatuses other than a reduction projection exposure type.

Figure 6:
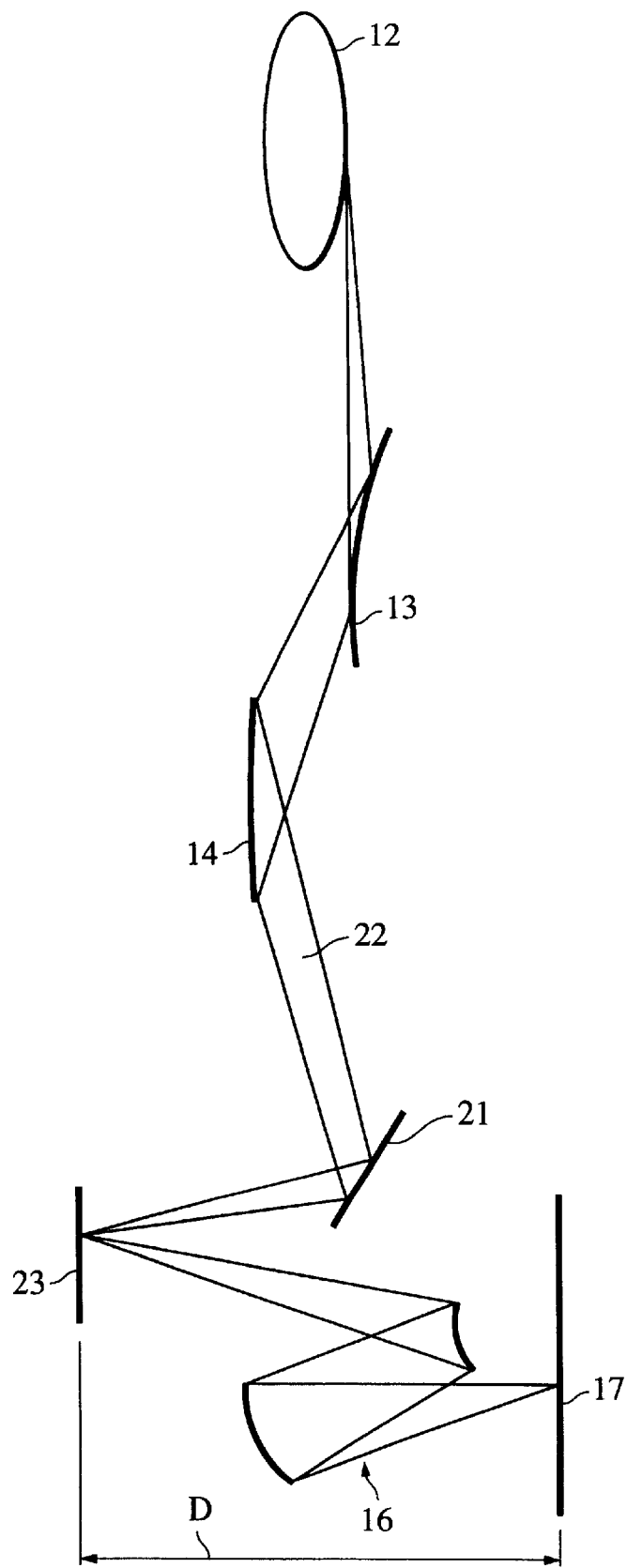
FIG. 6 is a view showing the arrangement of an optical system of an exposure apparatus using reflection-type masks according to the embodiments of the present invention.

Next, an exposure apparatus will be described with reference to FIG. 6, in which the reflection-type masks according to the first to sixth embodiments are used. FIG. 6 is a view showing an arrangement of an optical system of an exposure apparatus in which the reflection-type masks of the first to sixth embodiments are used.

As shown in FIG. 6, x-ray beams 22 generated from an x-ray source 12, such as a plasma x-ray generator, an undulator, or a synchrotron, are reflected by a convex total reflection mirror 13 and a concave multilayer reflection mirror 14 and enter a reflection-type mask 23. In the reflection mask 23, as described above, at least one of the Si layers is doped with an impurity. The x-ray beams 22 reflected at the reflection-type mask 23 reach a wafer 17 via a reduction projection optical system 16. The reflection-type mask 23 and the wafer 17 are mounted on stages (not shown), respectively, and are spaced at a distance D to oppose each other. In the arrangement described above, the stage mounting the reflection-type mask 23 and the stage mounting the wafer 17 are relatively moved at an appropriate speed, whereby a pattern in a necessary area of the reflection-type mask 23 is transferred onto one of a plurality of shot areas of the wafer 17. After a transfer is performed onto one area, the wafer 17 is moved stepwise, and the pattern transfer is performed onto another shot area. Subsequently, the operation (stepping and scanning sequence) described above is repeated, and hence, a plurality of patterns is transferred onto the wafer 17.

Figure 7:
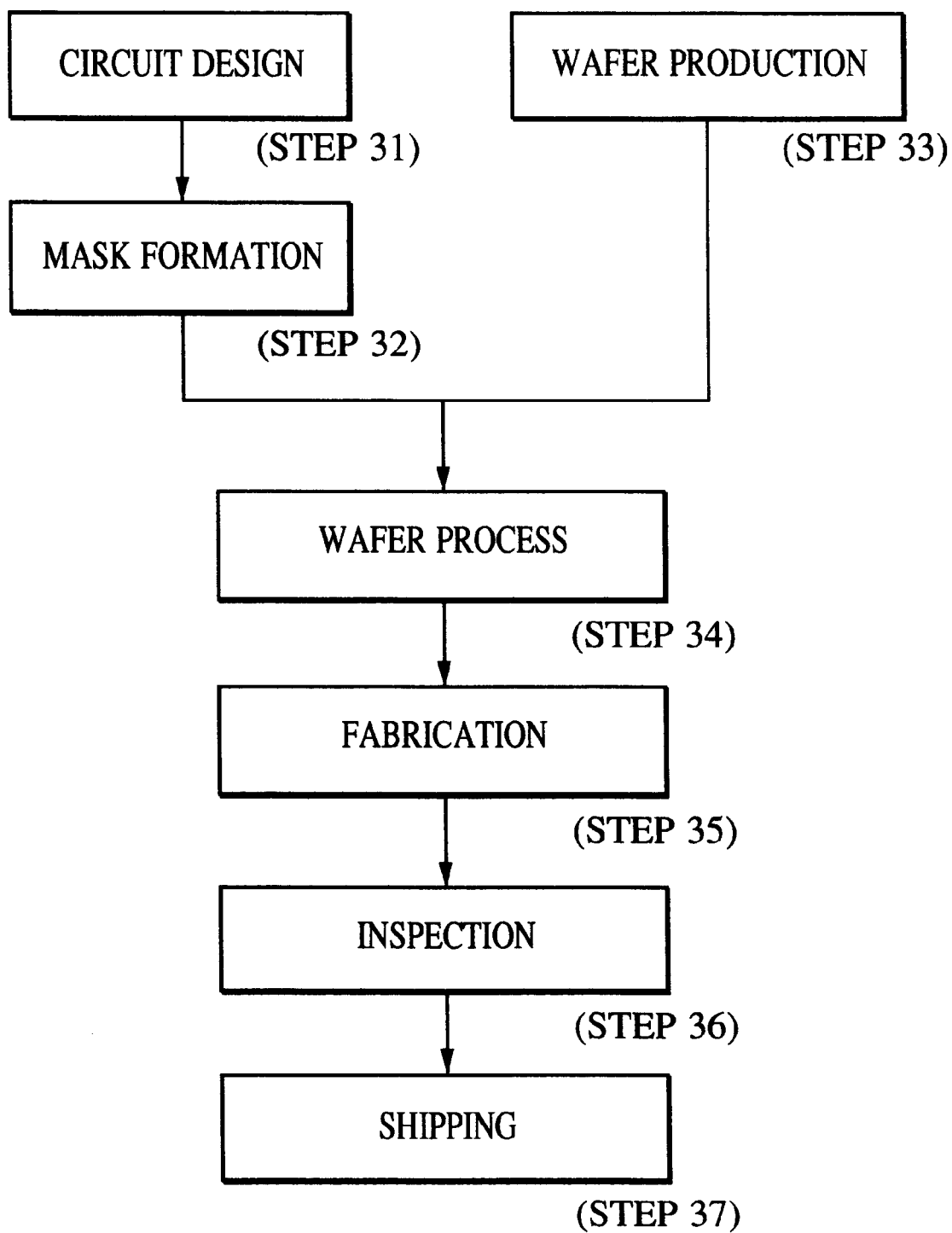
FIG. 7 is a flow chart showing steps of manufacturing a semiconductor device.

Next, a method of manufacturing a semiconductor device by using the exposure apparatus described above will be described with reference to FIGS. 7 and 8. FIG. 7 is a flow chart showing steps of manufacturing a semiconductor device. As the semiconductor device mentioned above, there may be mentioned a semiconductor chip, such as an IC (integrated circuit) or LSI (large-scale IC), a liquid crystal panel, a CCD (charge-coupled device), a thin-film magnetic head, a micro machine, or the like. In Step 31 (circuit design), pattern designing is performed for the semiconductor device. In Step 32 (mask formation), a reflection-type mask having the mask pattern thus designed is formed. In addition, in Step 33 (wafer production), wafers are produced by using materials, such as silicon and glass. In Step 34 (wafer process), which is called a front-end process, an actual circuit is formed on the wafer by a lithographic method using the wafer and the reflection-type mask 23 formed in Step 32. In subsequent Step 35 (fabrication), which is called a back-end process, semiconductor chips are produced from the wafer processed in Step 34, and this step includes an assembly step (dicing and bonding), a packaging step (chip encapsulation), and the like. In Step 36 (inspection), inspections for the semiconductor devices manufactured in Step 35, such as a performance test, a durability test, and the like, are performed. The semiconductor devices manufactured by the Steps described above are then shipped (Step 37). The reflection-type masks according to the first to sixth embodiments are formed in Step 32.

Figure 8:
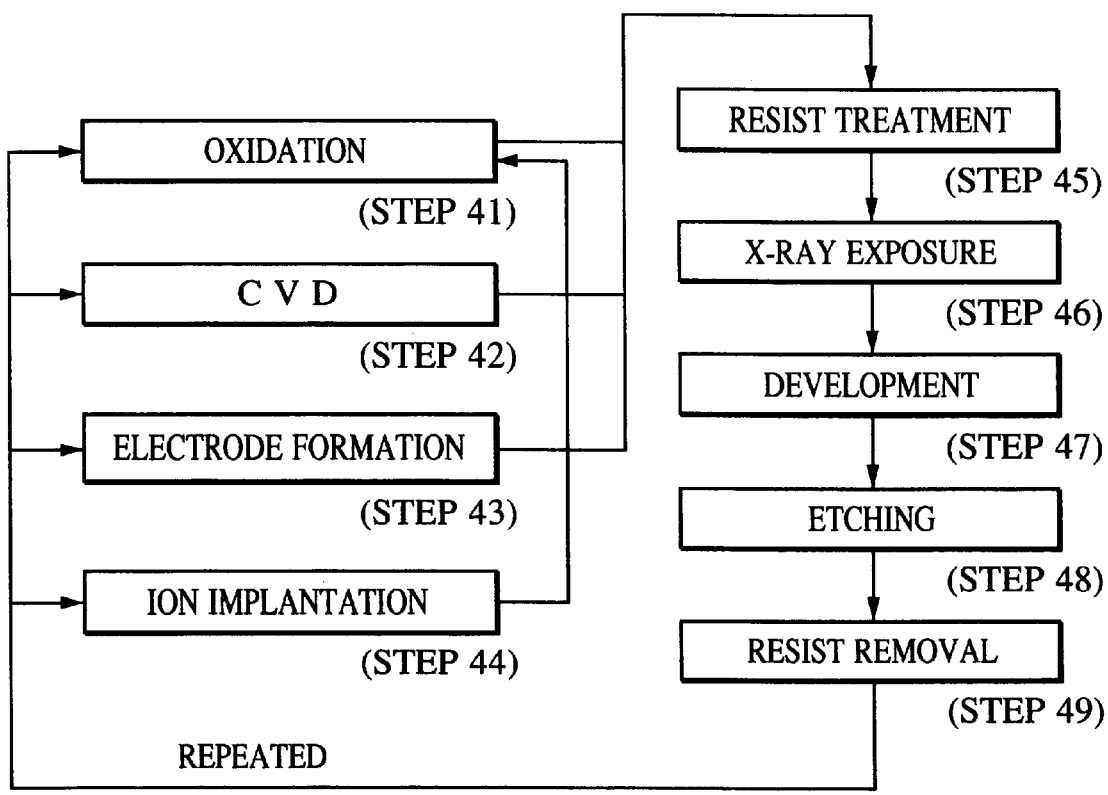
FIG. 8 is a flow chart showing detailed steps in a wafer process.

FIG. 8 is a flow chart showing detailed steps in the wafer process discussed above. As shown in FIG. 8, in Step 41 (oxidation), the surface of a wafer is oxidized. In Step 42 (CVD), an insulating film is formed on the surface of the wafer. In Step 43 (electrode formation), electrodes are formed on the wafer by evaporation. In Step 44 (ion implantation), ions are implanted into the wafer. In Step 45 (resist treatment), a resist (photosensitive material) is coated on the wafer. In Step 46 (x-ray exposure), a mask pattern of a reflection-type mask is exposed on the resist formed on a plurality of shot areas of the wafer by an exposure apparatus. In Step 47 (development), the exposed resist is developed. In Step 49 (resist removal), any unnecessary resist is removed, remaining after etching is performed, in Step 48. By repeating these steps described above, a multilayer circuit pattern can be formed on the wafer. The reflection-type masks for use in pattern exposure of the first to sixth embodiments are mounted on the exposure apparatus used in Step 46.

According to the reflection-type mask described above, when at least one of the layers constituting the multilayer reflection film is an impurity semiconductor, since the conductivity of the multilayer reflection film can be improved without significantly decreasing the reflectance thereof, charge up can be constrained, which is generated in the multilayer reflection film and in the absorption layer in the step of forming a mask pattern in the reflection-type mask. Accordingly, the accuracies of the line widths and a location of the mask pattern can be improved, and as a result, the accuracies of the line widths and a location of the circuit pattern formed on the wafer can be improved.

In addition, for example, when the absorption layer is formed by an electroplating method, since the uniformity of the thickness of the absorption layer is improved, which is formed on the multilayer reflection film, the reflectance of the absorption layer can be uniformly formed in the exposure area, and hence, the accuracies of the line widths and a location of the mask pattern can be improved. Furthermore, since the uniformity of the thickness of the absorption layer is improved, which is formed on the multilayer reflection film, a thin absorption layer can be formed, and hence, a shadowing effect of x-rays can be reduced, which is caused by the thickness of the absorption layer. Consequently, the accuracies of the line widths and a location of the circuit pattern can be improved.

Except as otherwise disclosed herein, the various components shown in outline or in block form in the Figures are individually well known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A reflection mask for use in exposing a pattern onto a photosensitive material, said mask comprising:
   a reflection area, having a multilayer film, for reflecting exposure light; and
   a non-reflection area which does not reflect the exposure light, said reflection area and said non-reflection area forming a mask pattern,
   wherein at least one layer of said multilayer film consists of an impurity semiconductor.

2. A mask according to claim 1, wherein said impurity semiconductor is an impurity-doped silicon.

3. A mask according to claim 1, wherein an impurity in said impurity semiconductor is one of the elements in Group III or Group V of the periodic table.

4. A mask according to claim 1, wherein said non-reflection area is produced by removing a portion of said multilayer film.

5. A mask according to claim 1, wherein said non-reflection area is produced by destroying a structure of a portion of said multilayer film.

6. A mask according to claim 1, wherein said mask is adapted for use with soft X-ray exposure as the pattern exposure.

7. A mask according to claim 1, wherein said mask is adapted for use with vacuum ultraviolet light exposure as the pattern exposure.

8. A mask according to claim 1, wherein said mask is adapted for use with reduction pattern projection as the pattern exposure.

9. A mask according to claim 1, wherein at least one layer of said multilayer film consists of molybdenum.

10. A mask according to claim 1, wherein at least one layer of said multilayer film consists of ruthenium.

11. A method of producing a reflection mask for use in exposing a pattern onto a photosensitive material, the mask comprising a reflection area, having a multilayer film, for reflecting exposure light and a non-reflection area which does not reflect the exposure light, wherein the reflection area and the non-reflection area form a mask pattern, said method comprising:

forming the multilayer film, such that at least one layer of the multilayer film consists of an impurity semiconductor; and forming the non-reflection area.

12. A method according to claim 11, wherein the impurity semiconductor is an impurity-doped silicon.

13. A method according to claim 11, wherein said step of forming the multilayer film comprises using one of an R.F. magnetron sputtering deposition method and an ion beam sputtering deposition method, and further comprising forming a layer of the impurity semiconductor by performing the sputtering deposition method using gas including the impurity.

14. A method according to claim 11, wherein said step of forming the multilayer film comprises using a chemical vapor deposition method, and further comprising forming a layer of the impurity semiconductor by performing the chemical vapor deposition method using gas including the impurity.

15. A method according to claim 11, further comprising performing an electron beam lithography method for producing the mask pattern.

16. A method according to claim 11, wherein said step of forming the non-reflection area comprises one of removing and destroying a portion of the multilayer film using a converging ion beam.

17. An exposure apparatus comprising:

a light source for emitting exposure light; and an illumination optical system for illuminating a reflection mask by the exposure light from said light source, the reflection mask comprising a reflection area, having a multilayer film, for reflecting exposure light and a non-reflection area which does not reflect the exposure light, the reflection area and the non-reflection area forming a mask pattern, and at least one layer of the multilayer film consisting of an impurity semiconductor, wherein a photosensitive material is exposed by the exposure light from the reflection mask, which is exposed by said illumination optical system.

18. A method of manufacturing a device, said method comprising:

illuminating a reflection mask by exposure light, the reflection mask comprising a reflection area, having a multilayer film, for reflecting exposure light and a non-reflection area which does not reflect the exposure light, the reflection area and the non-reflection area forming a mask pattern, and at least one layer of the multilayer film consisting of an impurity semiconductor;

exposing a photosensitive material by the exposure light from the reflection mask; and developing the photosensitive material exposed by the exposure light, wherein a circuit pattern is produced by using the developed photosensitive material.

19. A reflection mask for use in exposing a patterns onto a photosensitive material, said mask comprising:

a multilayer film for reflecting exposure light; and a patterned absorption layer, provided on said multilayer film, for absorbing exposure light, wherein at least one layer of said multilayer film consists of an impurity semiconductor.

20. A mask according to claim 19, wherein at least one layer of said multilayer film consists of molybdenum.

21. A mask according to claim 19, wherein at least one layer of said multilayer film consists of ruthenium.

22. A mask according to claim 19, wherein said absorption layer includes one of gold, tungsten, and tantalum.

23. A mask according to claim 19, wherein said impurity semiconductor is an impurity-doped silicon.

24. A mask according to claim 19, wherein an impurity in said impurity semiconductor is one of the elements in Group III or Group V of the periodic table.

25. A mask according to claim 19, wherein said mask is adapted for use with soft X-ray exposure as the pattern exposure.

26. A mask according to claim 19, wherein said mask is adapted for use with vacuum ultraviolet light exposure as the pattern exposure.

27. A mask according to claim 19, wherein said mask is adapted for use with reduction pattern projection as the pattern exposure.

28. An exposure apparatus comprising:

a light source of emitting exposure light;

a reflection mask according to claim 19;

a stage for carrying a wafer coated with photosensitive material;

an illumination optical system for illuminating said reflection mask by the exposure light from said light source; and a projection optical system for guiding light reflected by said reflection mask to the wafer on said stage.

29. A method of manufacturing a device, said method comprising:

exposing a photosenitive material by an exposure apparatus according to claim 28; and developing the photosensitive material.

30. A method of producing a reflection mask for use in exposing a pattern onto a photosensitive material, said method comprising:

forming a multilayer film for reflecting exposure light, such that at least one layer of the multilayer film consists of an impurity semiconductor; and forming a patterned absorption layer on the multilayer film.

31. A method according to claim 30, wherein said absorption layer is patterned by electron beam lithography.

32. A method according to claim 30, wherein the impurity semiconductor is an impurity-doped silicon.

33. A method according to claim 30, wherein said step of forming the multilayer film comprises using one of an R.F. magnetron sputtering deposition method and an ion beam sputtering deposition method, and futher comprising forming a layer of the impurity semiconductor by performing the sputtering deposition method using gas including the impurity.

34. A method according to claim 30, wherein said step of forming the multilayer film comprises using a chemical vapor deposition method, and further comprising forming a layer of the impurity semiconductor by performing the chemical vapor deposition method using gas including the impurity.

35. A multilayer film for reflecting light, wherein at least one layer of said multilayer film consists of an impurity semiconductor.

\* \* \* \* \*

UNITED STATES PATENT AND TRADEMARK OFFICE
CERTIFICATE OF CORRECTION

| | | |
|---|---|---|
| PATENT NO. | : 6,723,475 B2 | Page 1 of 1 |
| DATED | : April 20, 2004 | |
| INVENTOR(S) | : Masami Tsukamoto et al. | |

It is certified that error appears in the above-identified patent and that said Letters Patent is hereby corrected as shown below:

Title page,
Item [56], References Cited, OTHER PUBLICATIONS, second-listed reference, "Korean Office Action dated Aug. 1, 2003, issued in a corresponding Korean pat nt application.." should read -- Korean Office Action dated Aug. 1, 2003, issued in a corresponding Korean patent application. --.

Column 14,
Line 12, "patterns" should read -- pattern --.

Signed and Sealed this

Thirty-first Day of August, 2004

JON W. DUDAS
*Director of the United States Patent and Trademark Office*